United States Patent
Hsieh et al.

(10) Patent No.: US 11,910,574 B2
(45) Date of Patent: Feb. 20, 2024

(54) HEAT DISSIPATION UNIT

(71) Applicant: ASIA VITAL COMPONENTS CO., LTD., New Taipei (TW)

(72) Inventors: Kuo-Chun Hsieh, New Taipei (TW); Wei-Te Wu, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 246 days.

(21) Appl. No.: 17/137,323

(22) Filed: Dec. 29, 2020

(65) Prior Publication Data

US 2021/0222957 A1    Jul. 22, 2021

Related U.S. Application Data

(63) Continuation of application No. 16/055,138, filed on Aug. 5, 2018, now Pat. No. 11,160,197.

(51) Int. Cl.
| | |
|---|---|
| *F28D 15/04* | (2006.01) |
| *F28D 15/02* | (2006.01) |
| *H05K 7/20* | (2006.01) |

(52) U.S. Cl.
CPC ..... *H05K 7/20509* (2013.01); *F28D 15/0233* (2013.01); *F28D 15/046* (2013.01); *H05K 7/20336* (2013.01); *H05K 7/20436* (2013.01)

(58) Field of Classification Search
CPC .......... H05K 7/20509; H05K 7/20336; H05K 7/20436; F28D 15/0233; F28D 15/046
USPC .................................................... 165/104.26
See application file for complete search history.

(56) References Cited

U.S. PATENT DOCUMENTS

| | | | |
|---|---|---|---|
| 6,082,443 A | 7/2000 | Yamamoto et al. | |
| 8,316,921 B2 * | 11/2012 | Hou | F28D 15/046 165/104.21 |
| 8,813,834 B2 * | 8/2014 | Chin | H01L 23/427 165/104.26 |
| 10,527,355 B2 * | 1/2020 | Hurbi | F28F 23/02 |
| 2007/0240860 A1 * | 10/2007 | Meyer | H01L 23/427 29/890.032 |
| 2010/0157535 A1 * | 6/2010 | Oniki | H05K 7/20336 165/104.19 |
| 2018/0066898 A1 | 3/2018 | Lin | |

FOREIGN PATENT DOCUMENTS

| | | |
|---|---|---|
| CN | 201229543 Y | 4/2009 |
| CN | 201733557 U | 2/2011 |
| CN | 202025740 U | 11/2011 |
| CN | 204335252 U | 5/2015 |
| CN | 105722372 A | 6/2016 |

(Continued)

*Primary Examiner* — Joel M Attey
(74) *Attorney, Agent, or Firm* — Jackson IPG PLLC; Demian K. Jackson

(57) ABSTRACT

A heat dissipation unit includes a main body having a first and a second plate member, which are closed to each other to together define an airtight chamber in between them. A working fluid is filled in the airtight chamber. A first wick structure layer and a holding-down member are provided between the first and the second plate member and received in the airtight chamber. The holding-down member is located above the first wick structure layer, such that the first wick structure layer is held down by the holding-down member to be closely and flatly attached to the second plate member without warping.

9 Claims, 9 Drawing Sheets

(56) References Cited

FOREIGN PATENT DOCUMENTS

| | | |
|---|---|---|
| CN | 106941769 A | 7/2017 |
| CN | 107231780 A | 10/2017 |
| CN | 107801358 A | 3/2018 |
| CN | 208480199 U | 2/2019 |
| TW | 107210027 | 7/2018 |

* cited by examiner

HEAT DISSIPATION UNIT

The present application is a continuation of U.S. patent application Ser. No. 16/055,138, filed on Aug. 5, 2018.

FIELD OF THE INVENTION

The present invention relates to a heat dissipation unit, and more particularly to a heat dissipation unit internally having a wick structure layer being fixedly and flatly held in the heat dissipation unit without warping even if the wick structure layer is not fixed in place through sintering or diffusion bonding.

BACKGROUND OF THE INVENTION

The currently available electronic devices, handheld devices and mobile devices all have a largely reduced volume and weight but highly enhanced performance. However, the internal electronic elements of the electronic devices, handheld devices and mobile devices with enhanced performance inevitably produce more heat during operation. The produced high amount of heat must be removed via heat dissipation elements. For electronic devices, handheld devices and mobile devices having a very small volume and a narrow internal space, vapor chambers and flat heat pipes are the most often used heat dissipation elements for conducting and removing heat from the heat-producing electronic elements.

The vapor chamber and the flat heat pipe conduct and remove heat away from the heat-producing electronic elements through the vapor-liquid circulation of a working fluid filled in an airtight chamber of the vapor chamber and the flat heat pipe with the aid of a wick structure provided therein. Therefore, the wick structure plays an important role in the function and performance of the heat dissipation elements. For vapor chamber and flat heat pipe that are respectively formed of an upper and a lower plate member and have a very thin profile, a powder-sintered structure, a mesh-like structure or a plurality of grooves is usually internally provided on the upper or the lower plate member to serve as the wick structure. This type of wick structure might have the following problems: (1) the grooves internally provided on the plate member by way of machining would have a reverse influence on the structural strength of the plate member; (2) the forming of the powder-sintered structure on the plate member or the attaching the mesh-like structure to the plate member through diffusion bonding or welding would cause softening of the plate member during the high-temperature manufacturing process and accordingly, deteriorated structural strength thereof; and (3) the powder-sintered structure and the mesh-like structure could not be connected to the upper and lower plate member of the vapor chamber and the flat heat pipe when a sintering powder or a mish-like structure that is formed of a material, such as copper, dissimilar to that of the upper and the lower plate member of the vapor chamber and the flat heat pipe, such as aluminum.

Further, in the case of using an additionally applied wick structure, such as the powder-sintered structure or the mesh-like structure, the wick structures must be fixed in place on the very thin plate member. A mesh-like structure that is not fixed in place on the plate member tends to curl or warp and could not be flatly attached to the plate member.

Currently, spot welding and diffusion bonding are most frequently used by manufacturers to fixedly hold the additionally applied wick structure in place on the plate member. For this purpose, the wick structure and the plate member must first be held in place, and the wick structure is then fixed to the plate member of the vapor chamber or the flat heat pipe through spot welding or diffusion bonding. The drawbacks of using the spot welding and the diffusion bonding are that (1) the wick structure must first be held in place relative to the plate member, and (2) it is difficult to control the wick structure for the same to be fully flatly attached to an inner wall surface of the vapor chamber or an interior surface of the flat heat pipe. Therefore, the spot welding and diffusion bonding do not really solve the problem of fixing the conventional additionally applied wick structure in place in the vapor chamber or the flat heat pipe. On the other hand, in the event the powder-sintered wick structure could not be successfully and fully provided on the inner wall surface of the vapor chamber or the flat heat pipe, the powder-sintered wick structure might fail to form a porous structure to provide any capillary force. In a worse condition, the failed powder-sintered wick structure would even block a vapor space in the vapor chamber or the flat heat pipe to hinder the vapor-liquid circulation in and accordingly, the thermal conduction of the vapor chamber and the flat heat pipe. That is, as the spot welding and diffusion bonding, the sintering does not really solve the problem of fixing the conventional additionally applied wick structure in place in the vapor chamber or the flat heat pipe.

Therefore, for the present time, it is an important target to solve the problem of being unable to flatly attach the wick structure to the inner wall surface of the vapor chamber and the flat heat pipe.

SUMMARY OF THE INVENTION

A primary object of the present invention is to provide a heat dissipation unit, in which a wick structure can be fixed in place without the need of using high-temperature sintering and diffusion boding.

To achieve the above and other objects, the heat dissipation unit provided according to the present invention includes a main body.

The main body has a first and a second plate member, which are closed to each other to together define an airtight chamber in between them. A working fluid is filled in the airtight chamber. A first wick structure layer and a holding-down member are provided between the first and the second plate member and received in the airtight chamber. The holding-down member is located above the first wick structure layer, such that the first wick structure layer is held down by the holding-down member to be closely and flatly attached to the second plate member without warping.

By covering the holding-down member over the entire first wick structure layer to hold the latter down, the first wick structure layer is flatly laid in the airtight chamber to closely attach to an inner wall surface of main body without warping, even if the first wick structure layer is not fixed in place using sintering or diffusion bonding or welding.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
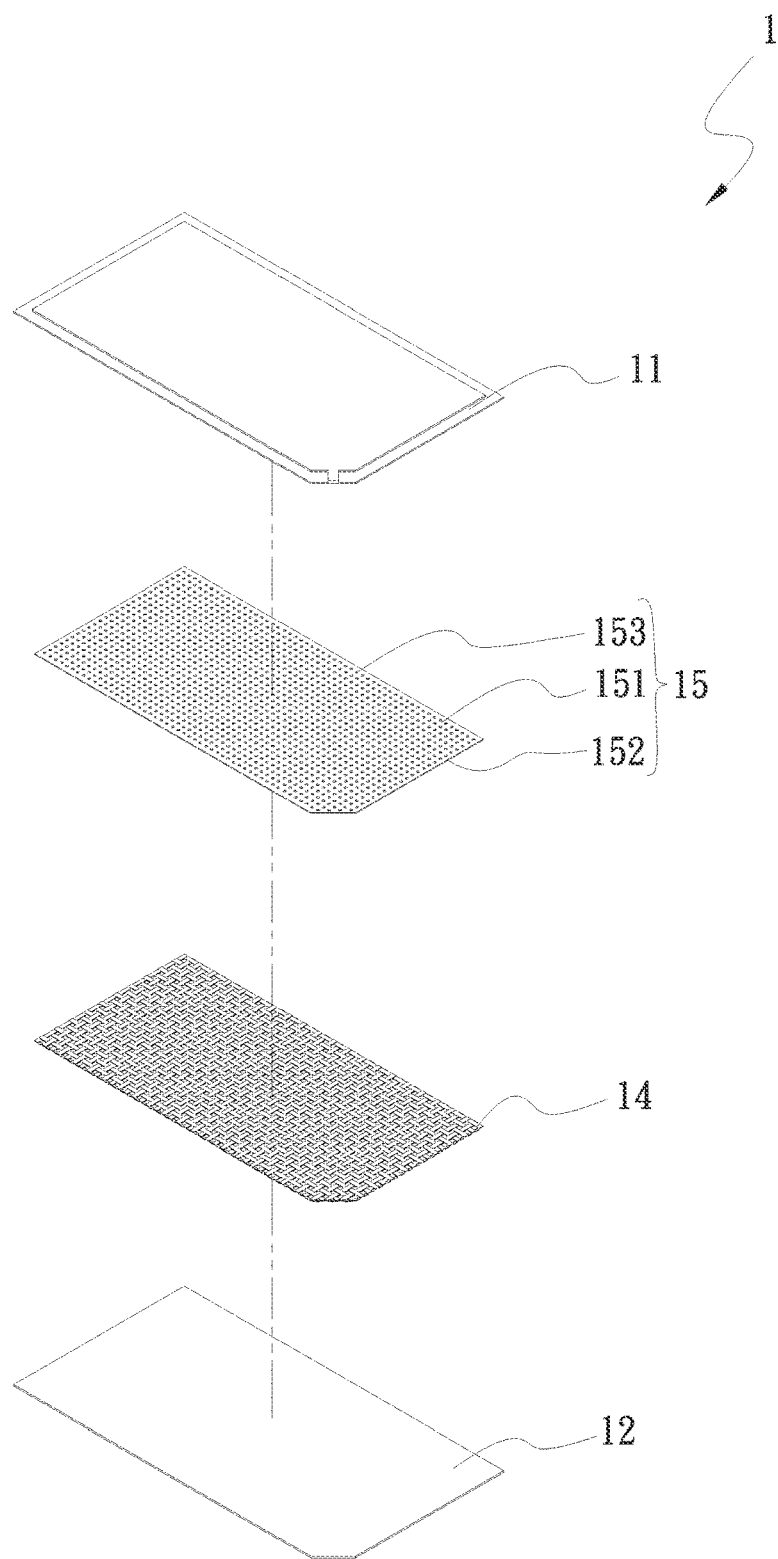
FIG. 1 is an exploded perspective view of a heat dissipation unit according to a first embodiment of the present invention.

The present invention will now be described with some preferred embodiments thereof and by referring to the accompanying drawings. For the purpose of easy to understand, elements that are the same in the preferred embodiments are denoted by the same reference numerals.

Figure 2:
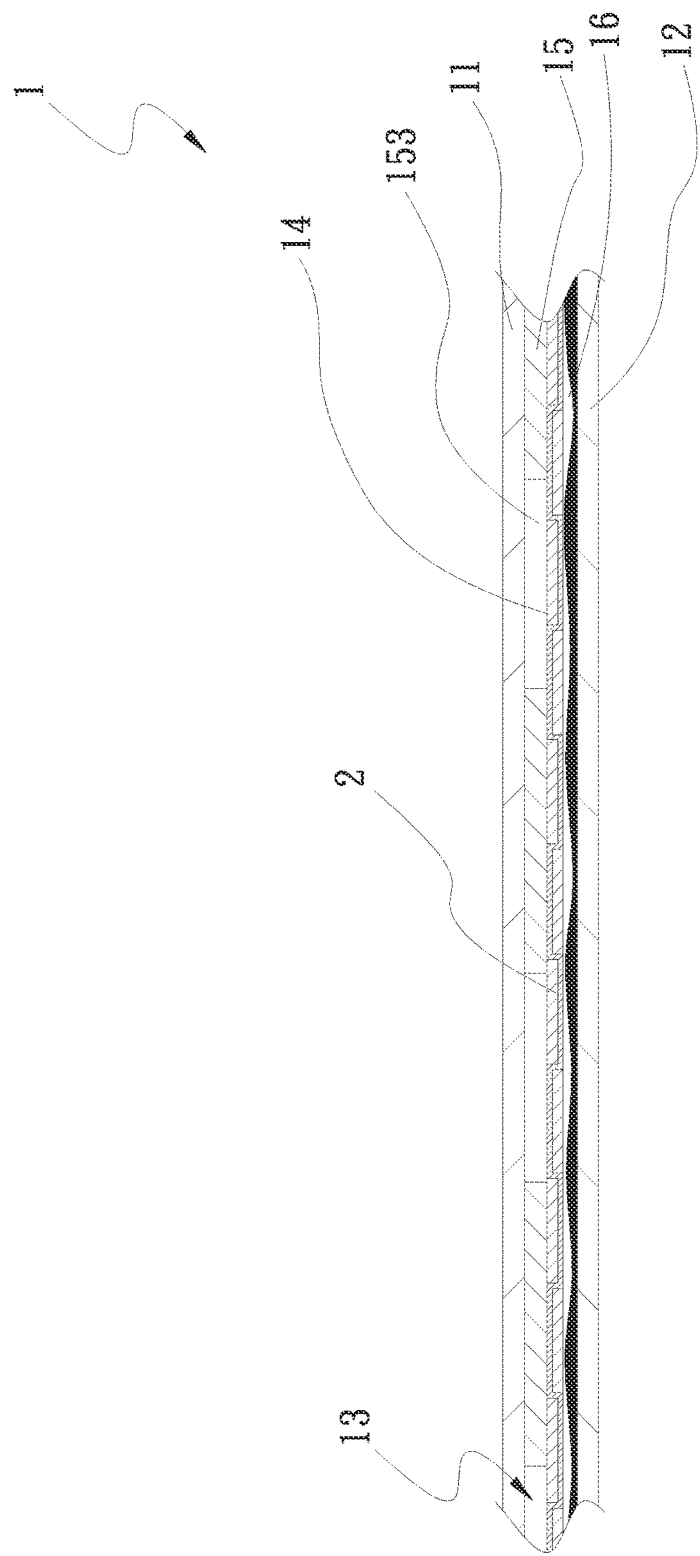
FIG. 2 is an assembled sectional view of the heat dissipation unit according to the first embodiment of the present invention.

Please refer to FIGS. 1 and 2, which are exploded perspective view and assembled sectional view, respectively, of a heat dissipation unit according to a first embodiment of the present invention. As shown, in the first embodiment, the heat dissipation unit includes a main body 1.

The main body 1 includes a first plate member 11 and a second plate member 12, which are closed to each other to together define an airtight chamber 13 in between them. A working fluid 2 is filled in the airtight chamber 13. A first wick structure layer 14 and a holding-down member 15 are provided between the first and the second plate member 11, 12 and received in the airtight chamber 13. The holding-down member 15 is located above the first wick structure layer 14. The main body 1 has an upper side and a lower side. In the first embodiment, the first plate member 11 is located at the upper side and the second plate member 12 is located at the lower side of the main body 1. Any one of the first and the second plate member 11, 12 can be in contact with a heat source. In the illustrated first embodiment, it is the second plate member 12 that is in contact with at least one heat source (not shown) for thermal conduction.

The first wick structure layer 14 can be any one of a powder-sintered structure, a woven mesh structure, a corrugated plate, and a plate with a plurality of grooves. The holding-down member 15 holds down and covers the entire first wick structure layer 14, such that the first wick structure layer 14 is flatly held in the airtight chamber 13 and is completely flatly attached to a surface of the second plate member 12. With the holding-down member 15 that holds down and covers the entire first wick structure layer 14, no welding, sintering, or any other means is further needed to fix the first wick structure layer 14 in place, while the first wick structure layer 14 can be firmly held in the airtight chamber 13 without warping, allowing the working fluid 2 to flow back efficiently during a vapor-liquid circulation occurred over the second plate member 12 in the airtight chamber 13. Further, with the entire first wick structure layer 14 being flatly and tightly attached to the second plate member 12 in the airtight chamber 13, it is able to increase the water content of the second plate member 12 and prevent the same from being overheated.

The first and the second plate member 11, 12 can be made of gold, silver, copper, iron, aluminum, aluminum alloys, stainless steel, ceramic, commercially pure titanium, or titanium alloys.

A second wick structure layer 16 can be provided on one side surface of any one of the first and the second plate member 11, 12. The second wick structure layer 16 can be a powder-sintered structure, a mesh-like structure, a plurality of grooves, or a fibrous structure. In the illustrated first embodiment, the second wick structure layer 16 is provided on one side surface of the second plate member 12 facing toward the airtight chamber 13 and is a plurality of grooves, which form flow passageways for the working fluid 2 to flow back or diffuse transversely or longitudinally in the airtight chamber 13. However, it is understood the above description of the position and the type of the second wick structure layer 16 is only illustrative and not restrictive.

The holding-down member 15 has a first side 151 and an opposite second side 152, and is provided with a plurality of perforations 153. The perforations 153 can be round, square or polygonal in shape or can be any other geometrical shape. In the illustrated first embodiment, the perforations 153 are round in shape but not particularly limited thereto. The perforations 153 perpendicularly extend through the holding-down member 15 to communicate the first side 151 with the second side 152. The holding-down member 15 can be made of a metal or a non-metal material. In the case of being made of a metal material, the material can be a thin film of gold, silver, copper, iron, aluminum, an aluminum alloy, commercially pure titanium, a titanium alloy or stainless steel. In the case of being made of a non-metal material, the material can be a thin film of a graphite material, a ceramic material or a polymeric material. According to the present invention, there is not any particular limitation to the manufacturing method of the above-mentioned metal or non-metal materials for making the holding-down member 15.

Figure 3:
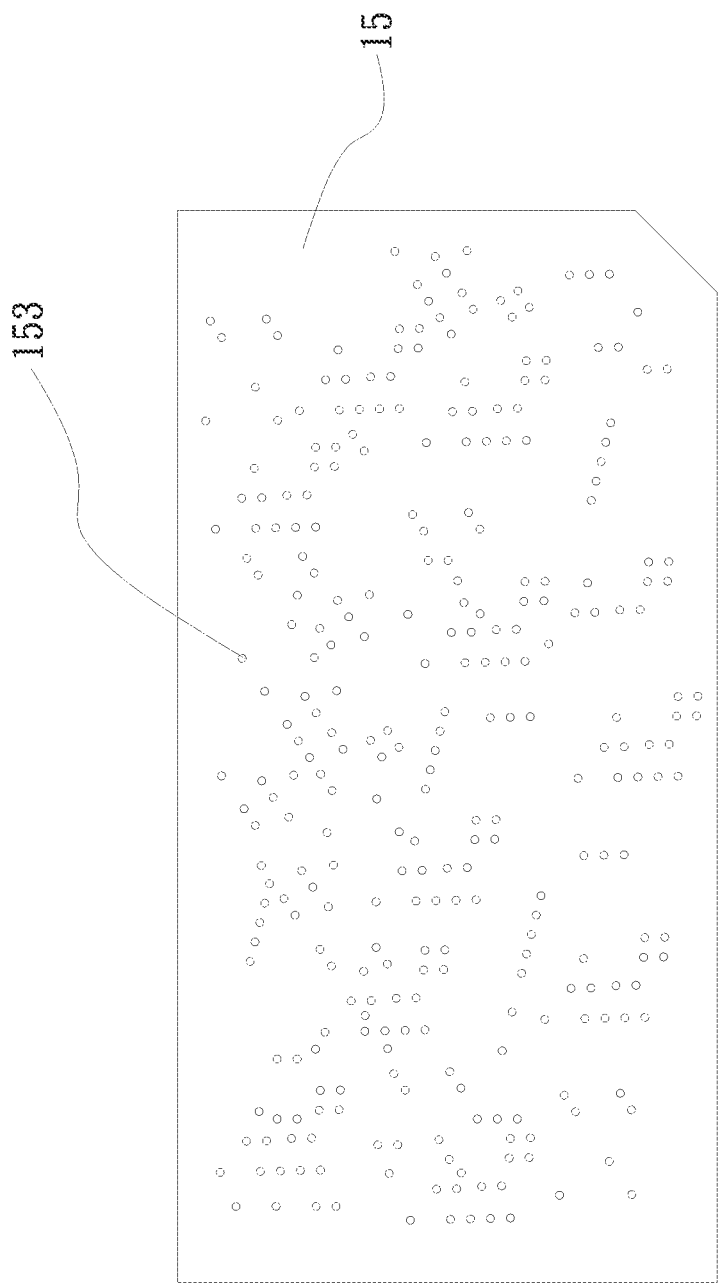
FIG. 3 is a top view of an example of a holding-down member included in the heat dissipation unit of the present invention.

Please refer to FIG. 3, which is a top view of a first example of a holding-down member 15 included in the heat dissipation unit of the present invention. As shown, the perforations 153 can be distributed or arranged on the holding-down member 15 in a regular array or in an irregular array. In the illustrated first embodiment of the present invention, the perforations 153 are irregularly distributed on the holding-down member 15.

Figure 4:
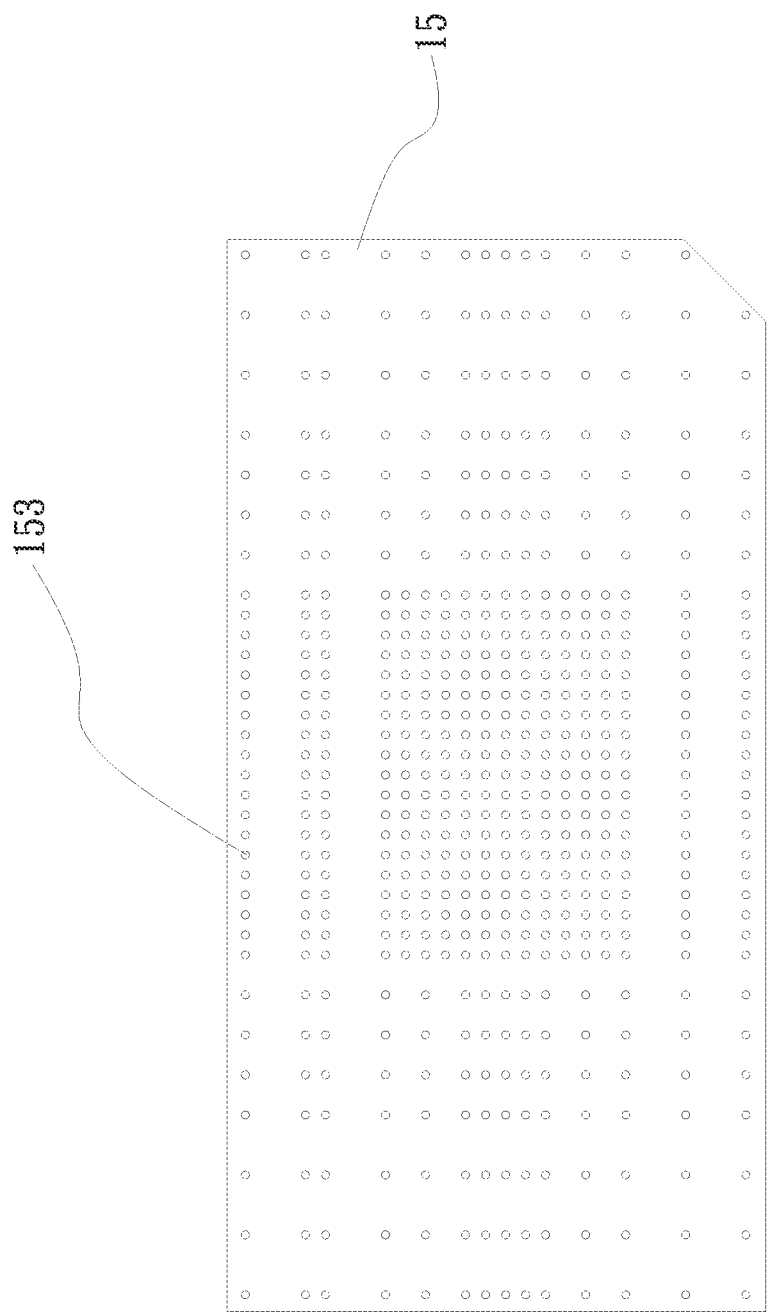
FIG. 4 is a top view of another example of the holding-down member included in the heat dissipation unit of the present invention.

Please refer to FIG. 4, which is a top view of a second example of a holding-down member 15 included in the heat dissipation unit of the present invention. As shown, the perforations 153 can be densely or sparsely distributed or arranged on the holding-down member 15. In the illustrated first embodiment of the present invention, the perforations 153 are densely arranged on the holding-down member 15.

Figure 5A:
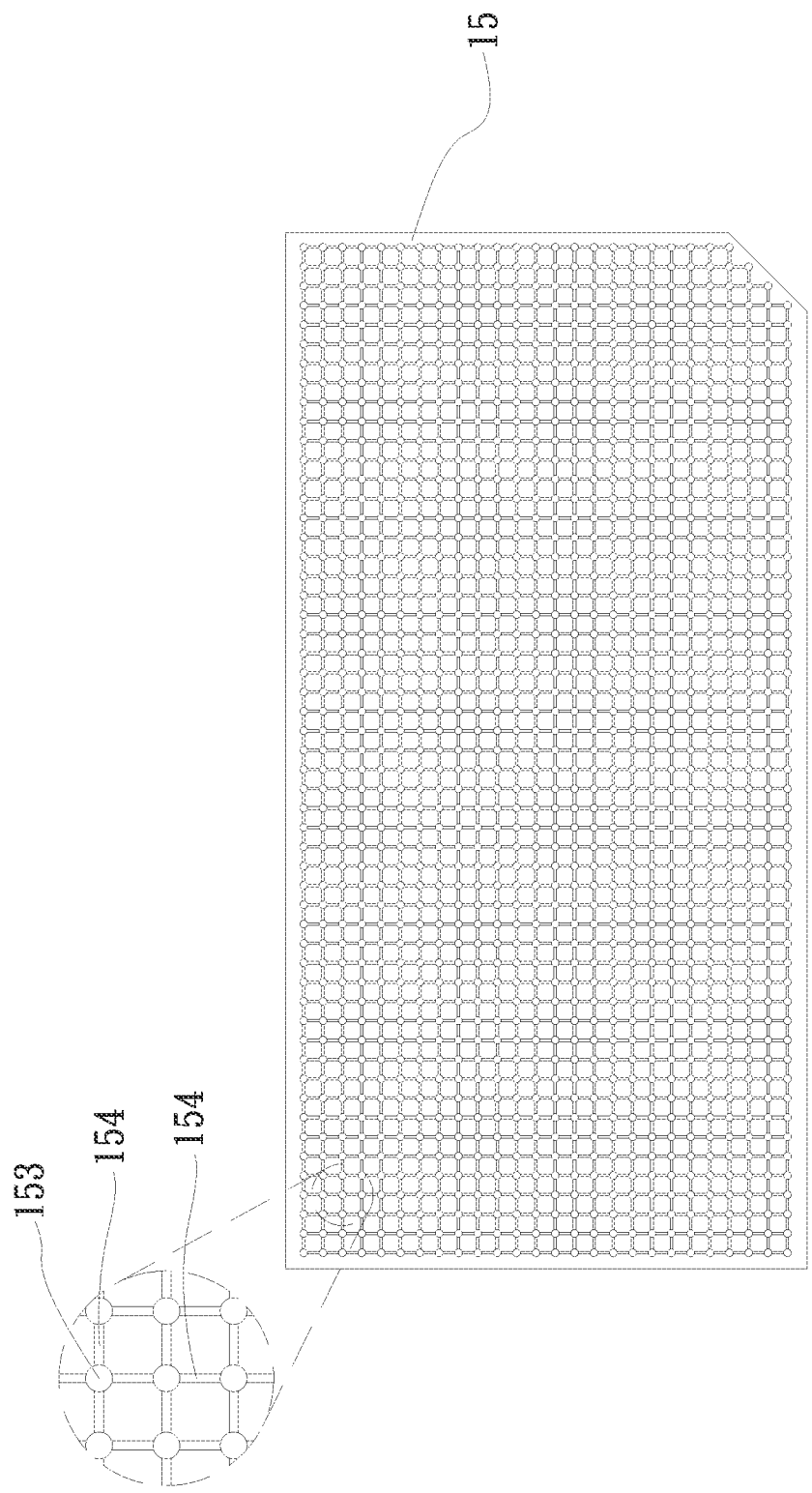
FIGS. 5A and 5B are top view and sectional view, respectively, of a further example of the holding-down member included in the heat dissipation unit of the present invention.
Figure 5B:
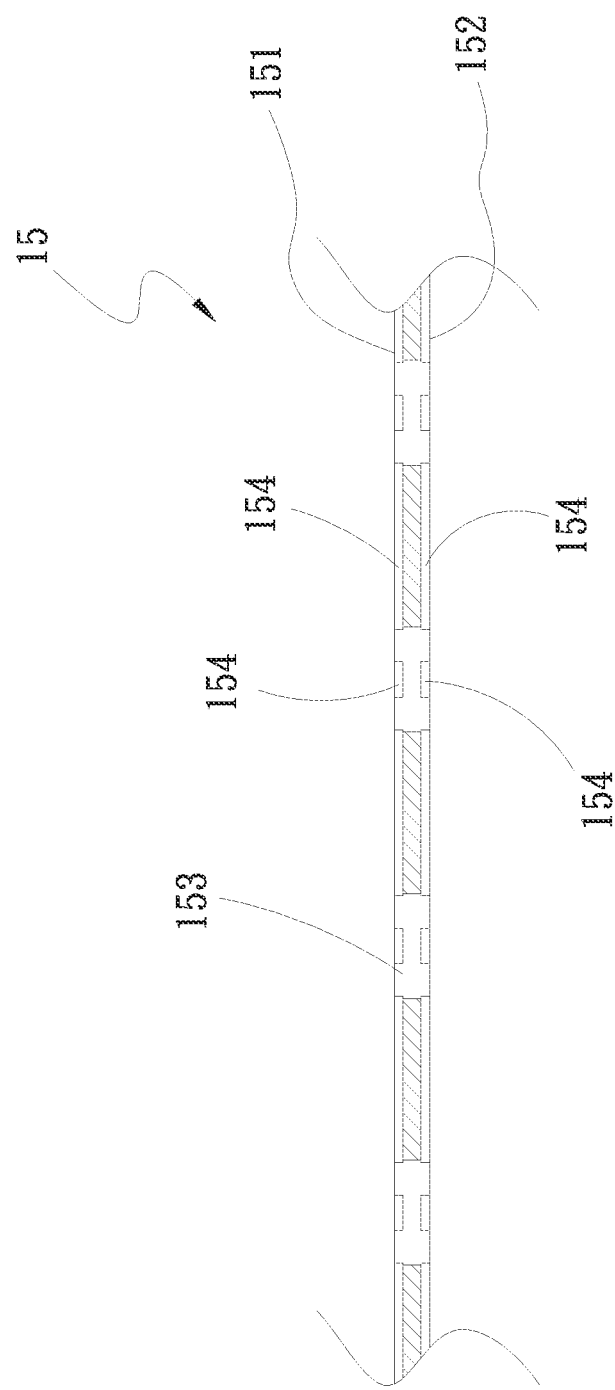

FIGS. 5A and 5B are top view and sectional view, respectively, of a third example of the holding-down member 15 included in the heat dissipation unit of the present invention. As shown, in addition to the perforations 153 perpendicularly formed on the holding-down member 15 to communicate the first and the second side 151, 152 with each other, a plurality of parallel or intersected grooves 154 can be further horizontally formed on any one or both of the first and the second side 151, 152 of the holding-down member 15 to connect the perforations 153 to one another. In the illustrated first embodiment of the present invention, the grooves 154 are provided on both of the first and the second side 151, 152 without being particularly limited thereto. By providing the grooves 154, the vaporizing and diffusing efficiency as well as the condensing and flowing back efficiency of the working fluid 2 in the airtight chamber 13 can be increased.

The perforations 153 provided on the holding-down member 15, as shown in FIGS. 3, 4, 5A and 5B, can be located corresponding to the heat sources to be contacted with the main body 1. For example, the perforations 153 can be more densely provided at positions on the holding-down member 15 that will be in contact with the heat sources. The perforations 153 on the holding-down member 15 provide flowing paths for the vaporized working fluid 2, and the first wick structure layer 14 provides flowing back paths for the condensed working fluid 2. In other words, with the perforations 153 and the first wick structure layer 14, a vapor-liquid separation effect can be achieved to enable increased vapor-liquid circulation efficiency.

Figure 6:
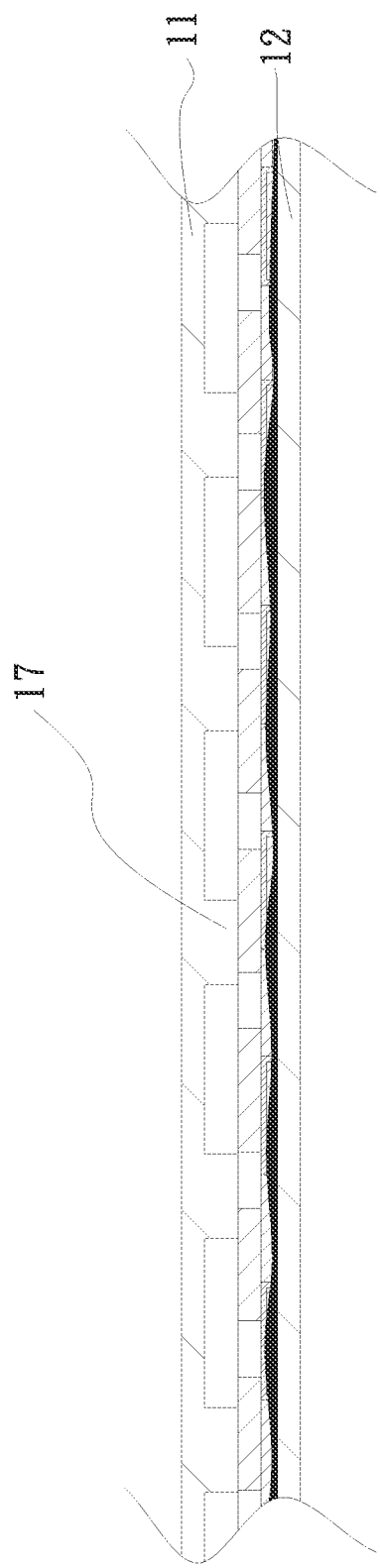
FIG. 6 is an assembled sectional view of a heat dissipation unit according to a second embodiment of the present invention.

FIG. 6 is an assembled sectional view of a heat dissipation unit according to a second embodiment of the present invention. As shown, in the second embodiment, any one of the first and the second plate member 11, 12 is formed on one side surface with a plurality of alternate recesses and protrusions by way of a machining process, such as milling or planing, or by a non-traditional process, such as etching, so as to serve as supporting sections 17. It is noted the protrusions and the recesses so formed to serve as the supporting sections 17 are located on one side surface of the first or the second plate member 11, 12 that faces toward the other one of the first or the second plate member 11, 12, so that the protrusions are pressed against one side surface of the other plate member 11 or 12.

Figure 7:
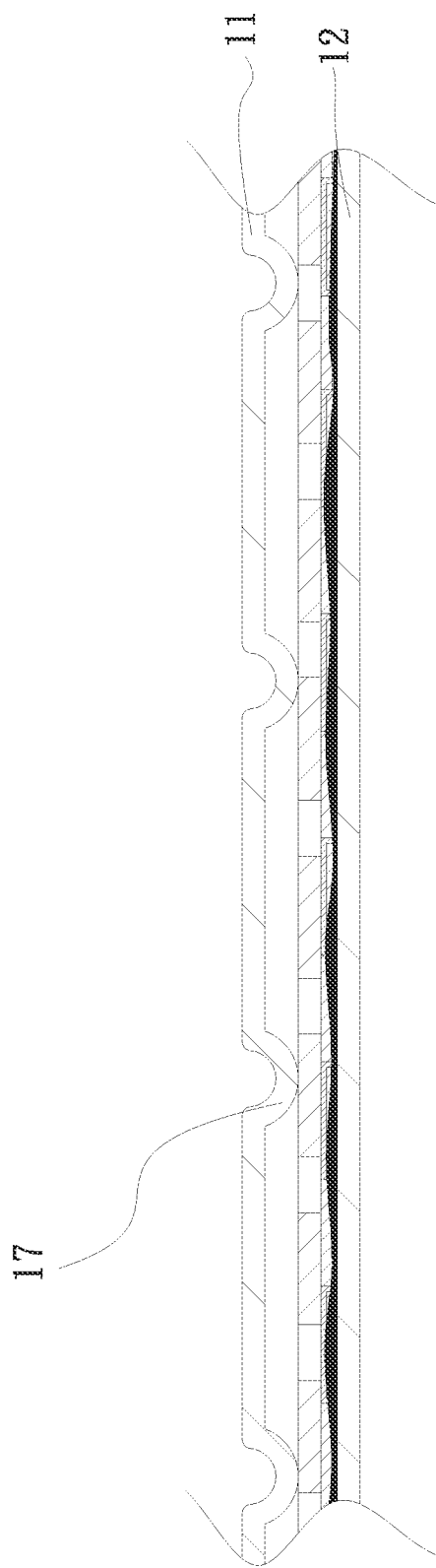
FIG. 7 is an assembled sectional view of a heat dissipation unit according to a third embodiment of the present invention.

FIG. 7 is an assembled sectional view of a heat dissipation unit according to a third embodiment of the present invention. As shown, in the third embodiment, the main body 1 includes a plurality of supporting sections 17, which can be selectively formed on the first or the second plate member 11, 12 to protrude from one side surface to the other side surface thereof. In the illustrated third embodiment, the supporting structures 17 are formed by stamping or forging, in which an external deforming force is applied to an outer side surface toward an inner side surface of the first or the second plate member 11, 12.

Figure 8:
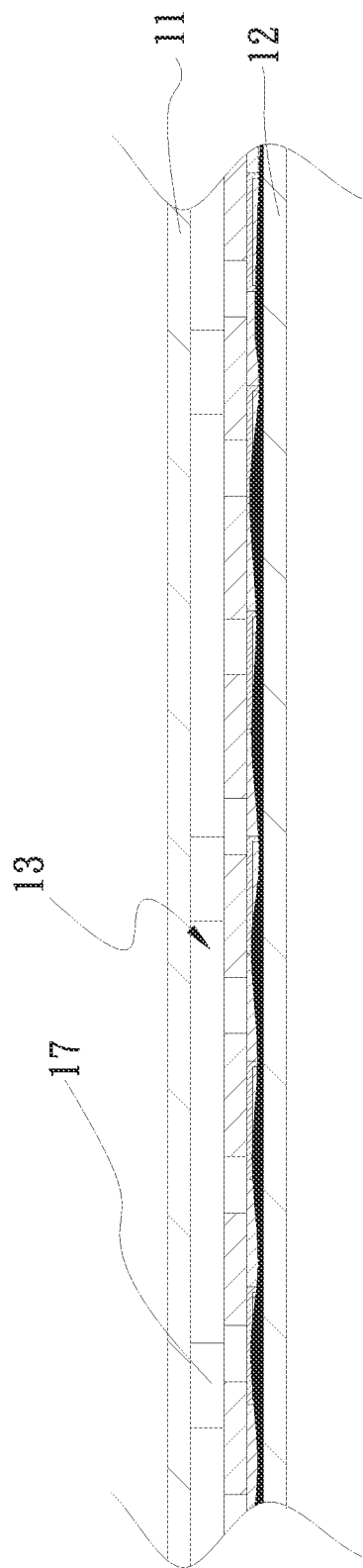
FIG. 8 is an assembled sectional view of a heat dissipation unit according to a fourth embodiment of the present invention.

FIG. 8 is an assembled sectional view of a heat dissipation unit according to a fourth embodiment of the present invention. As shown, in the fourth embodiment, the main body 1 includes a plurality of supporting sections 17, which are in the form of supporting members and located in the airtight chamber 13. The supporting members 17 can be copper posts, aluminum posts, titanium posts, stainless steel posts, ceramic posts or powder-sintered posts, which are located in the airtight chamber 13 to provide an increased internal supporting strength to the main body 1.

In all of the previously described embodiments, the perforations 153 must be arranged on the holding-down member 15 with a density that ensures the spacing among the perforations 153 is smaller than an outer diameter of the supporting sections 17, so that the supporting sections 17 can always press against the holding-down member 15 and the first wick structure layer 14 while the perforations 153 allow the vaporized working fluid 2 to flow therethrough and diffuse in the airtight chamber 13 in a direction perpendicular to the main body 1.

With the present invention, the wick structure for the vapor chamber or the flat heat pipe can still be stably, flatly mounted in the airtight chamber without warping even if it is not particularly fixed in place by sintering, diffusion bonding or welding. Further, the present invention provides a good solution in the case the wick structure is made of a material dissimilar to that of the main body and could not be fixed to an inner surface of the airtight chamber in the main body through sintering, diffusion boding or welding.

By covering the holding-down member 15 over the entire first wick structure layer 14 to hold the latter down, the first wick structure layer 14 is flatly laid in the airtight chamber 13 to be closely attached to the second plate member 12 without warping or sliding. Further, with the perforations 153 provided on the holding-down member 15, vapor-liquid circulation can occur in the main body 1 not only in a horizontal direction, but also in a vertical direction in the airtight chamber 13. And, with the grooves 154 provided on the holding-down member 15, the working fluid 2 can also horizontally flow back and diffuse in the airtight chamber 13 of the main body 1 with increased efficiency.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A heat dissipation unit comprising:
a main body including a first plate member and a second plate member closed to each other to together define an airtight chamber in between them;
a working fluid being filled in the airtight chamber;
a first wick structure layer; and
a holding-down member provided between the first and the second plate member in the airtight chamber and located above the first wick structure layer, such that the first wick structure is planarly and completely held down and flattened by the holding-down member to be completely and flatly attached to the second plate member, without sintering, diffusion bonding, or welding, wherein the holding-down member has a first side, an opposite second side, a plurality of perforations perpendicularly formed and extending between the first side with the second side, and a plurality of grooves formed on one or both of the first and second sides and connecting the perforations with each other, the holding-down member is a non-wick structure, and an upper side of the holding-down member is attached to the first plate member.

2. The heat dissipation unit as claimed in claim 1, wherein the first and the second plate member are made of a material selected from the group consisting of gold, silver, copper, iron, aluminum, an aluminum alloy, stainless steel, ceramic, titanium, and a titanium alloy; and wherein the holding-down member is made of a metal or a non-metal material.

3. The heat dissipation unit as claimed in claim 1, wherein any one of the first and the second plate member is provided on one side surface with a second wick structure layer; and the second wick structure layer being selected from the group consisting of a powder-sintered structure, a mesh-like structure, a plurality of grooves, and a fibrous structure.

4. The heat dissipation unit as claimed in claim 1, wherein the perforations have a shape selected from the group consisting of a round, a square, a polygonal and any other geometrical shape.

5. The heat dissipation unit as claimed in claim 4, wherein the perforations provided on the holding-down member are distributed and arranged in a manner selected from the group consisting of a regular array and an irregular array.

6. The heat dissipation unit as claimed in claim 4, wherein the perforations provided on the holding-down member are distributed and arranged to be either adjacent to one another or non-adjacent to one another.

7. The heat dissipation unit as claimed in claim 1, wherein the first wick structure layer is selected from the group consisting of a powder-sintered structure, a woven mesh structure, a corrugated plate, and a plate with a plurality of grooves.

8. The heat dissipation unit as claimed in claim 2, wherein the material for making the holding-down member being the metal material selected from the group consisting of gold, silver, copper, iron, aluminum, an aluminum alloy, titanium, a titanium alloy, and stainless steel.

9. The heat dissipation unit as claimed in claim 2, wherein the material for making the holding-down member being the non-metal material selected from the group consisting of a graphite material, a ceramic material and a polymeric material.

\* \* \* \* \*